United States Patent [19]
Vidusek

[11] Patent Number: 5,370,969
[45] Date of Patent: Dec. 6, 1994

[54] TRILAYER LITHOGRAPHIC PROCESS

[75] Inventor: David A. Vidusek, Camas, Wash.

[73] Assignees: Sharp Kabushiki Kaisha, Osaka, Japan; Sharp Microelectronics Technology, Inc., Camas, Wash.

[21] Appl. No.: 922,983

[22] Filed: Jul. 28, 1992

[51] Int. Cl.$^5$ ............................................. G03C 1/492
[52] U.S. Cl. ................................... 430/272; 430/273; 430/311; 430/313; 430/314; 430/316; 430/317; 430/318; 430/319; 430/322; 430/323; 430/324; 430/325; 430/326
[58] Field of Search ............... 430/272, 273, 313, 314, 430/311, 316, 317, 318, 319, 322, 323, 324, 325, 326

[56] References Cited

U.S. PATENT DOCUMENTS

| | | | |
|---|---|---|---|
| 4,810,617 | 3/1989 | White et al. | 430/272 |
| 4,983,537 | 1/1991 | Wei | 437/69 |
| 5,077,234 | 12/1991 | Scoopo et al. | 437/67 |
| 5,219,788 | 6/1993 | Abernathey et al. | 430/272 |

Primary Examiner—Jack P. Brammer
Attorney, Agent, or Firm—Fliesler, Dubb, Meyer & Lovejoy

[57] ABSTRACT

The invention provides a trilayer structure and photolithographic method which permits use of high-resolution optics with a relatively small depth of focus for patterning a substrate. A trilayer lithographic structure in accordance with the invention comprises: (a) an outgas resistant planarization layer deposited on a substrate; (b) a chemical-vapor-deposited interfacial film formed on the planarization layer; and (c) a photosensitive resist layer of a thickness equal to or less than one micron deposited on the interfacial film. A method in accordance with the invention comprises the steps of: (a) depositing an out-gas resistant planarization layer on a substrate; (b) chemical-vapor-depositing an interfacial film on the planarization layer; and (c) forming a photosensitive resist layer of a thickness equal to or less than one micron on the interfacial film.

36 Claims, 2 Drawing Sheets

TRILAYER LITHOGRAPHIC PROCESS

BACKGROUND

1. Field of the Invention

The invention relates generally to lithographic image development.

The invention relates more specifically to an improved trilayer lithographic process for use within the semiconductor fabrication arts in conjunction with an image projection system having a narrow depth of focus.

2. Cross Reference to Related Applications

The following copending U.S. patent application is assigned to the assignee of the present application, is related to the present application and its disclosure is incorporated herein by reference:

(A) Ser. No. 07/893,702 filed Jun. 5, 1992 by Tatsuo Nakato et al. and entitled, SILYLATED PHOTORESIST LAYER AND PLANARIZING METHOD.

3. Description of the Related Art

High-resolution photolithographic imaging and development techniques are routinely used to mass produce high-density semiconductor devices and other microscopically sized devices (e.g. micro-machines) at low per-unit cost.

A type of reduction-projection camera, referred to in the semiconductor industry as a wafer-stepper, projects a pattern image onto a photosensitive layer (photoresist layer). The photosensitive layer is then developed to produce apertures in the photosensitive layer corresponding to the projected image. The developed photoresist layer is then hardened to withstand a next applied modifying agent. The modifying agent enters through the apertures of the hardened resist layer to act on exposed portions of the substrate.

Each successive generation of smaller-sized devices calls for a greater degree of resolution in the projected image and a finer degree of image replication in the development of the photosensitive layer. The call for images of ever-decreasing dimensions and greater resolution brings about lens designs of ever-increasing numerical aperture for each given wavelength.

Unfortunately, depth of focus decreases as numerical aperture increases at a given wavelength. It becomes difficult to faithfully develop and reproduce an image pattern in a photosensitive layer if the photosensitive layer is relatively thick and the depth of focus of the image projection optics is decreased to a point where it approaches, or worse yet, becomes smaller than the thickness of the photosensitive layer. This is particularly a problem when the photosensitive layer is conformably deposited on a nonplanar substrate surface.

A trilayer development process has been proposed recently by others (M. Tanigawa and H. Tabuchi of Sharp, Japan). The proposed process deposits a planarizing layer composed of a photoresist solution containing diazonapthoquinone (DNQ) or a like light-sensitive material, onto a nonplanar substrate surface. The planarizing layer is then hardened and flowed into planarity by baking. A liquid-like SOG (Spin-On Glass) layer is next spin-coated onto the planarizing layer and hardened by baking. Finally, a thin layer of liquid photoresist material is spin coated onto the SOG layer and bake-hardened to thereby create a solid photoresist layer having a thickness of one micron or less. The solid photoresist layer is then patterned using a high resolution imaging system and developed with an etchant that attacks the material of the photoresist layer. The SOG layer functions as an etch-stop.

There are a number of drawbacks to the proposed technique. Light sensitive components of the planarization layer, such as diazonapthoquinone (DNQ), tend to decompose and outgas nitrogen at the temperatures normally used for flowing the planarization layer, for hardening the SOG layer, and for hardening the topmost resist layer. The outgassed nitrogen bubbles can interfere with the planarity of the overall resist structure, create adhesion problems at the substrate/planarization layer interface and produce a variety of stress-related artifacts.

SOG (Spin-On Glass) generally includes particulate matter which adds to surface roughness and creates isotropy in the deposition and adhesion of the subsequently deposited photoresist layer. Defects and nonuniformity in the SOG layer also lead to isotropy in a subsequent photoresist etching (development) step. The photoresist layer has to be made sufficiently thick to compensate for roughness and etch-selectivity in the underlying SOG layer. This places an undesirable lower limit on the depth of focus that must be provided by the image projection system, and consequentially, an undesirable upper limit on the numerical aperture and resolution of the image projection system.

Finally, because wet chemistries are utilized in the formation of each of the planarizing layer, the SOG layer, and the photoresist layer, there is the danger that inadequate hardening will leave a volatile residue between layers. This residue can outgas during further processing and interfere undesirably with subsequent device fabrication steps.

SUMMARY OF THE INVENTION

The invention overcomes the above-mentioned problems by providing an improved trilayer lithographic process.

A trilayer lithographic structure in accordance with the invention comprises: (a) a planarization layer, consisting essentially of a non-outgassing material (an outgas resistant material), deposited on a substrate; (b) a chemical-vapor-deposited interfacial film formed on the planarization layer; and (c) a photosensitive resist layer of a thickness equal to or less than one micron deposited on the interfacial film.

A method in accordance with the invention comprises the steps of: (a) depositing a non-outgassing planarization layer on a substrate; (b) chemical-vapor-depositing an interfacial film on the planarization layer; and (c) forming a photosensitive resist layer of a thickness equal to or less than one micron on the interfacial film.

BRIEF DESCRIPTION OF THE DRAWINGS

The below detailed description makes reference to the accompanying drawings, in which.

DETAILED DESCRIPTION

Figure 1:
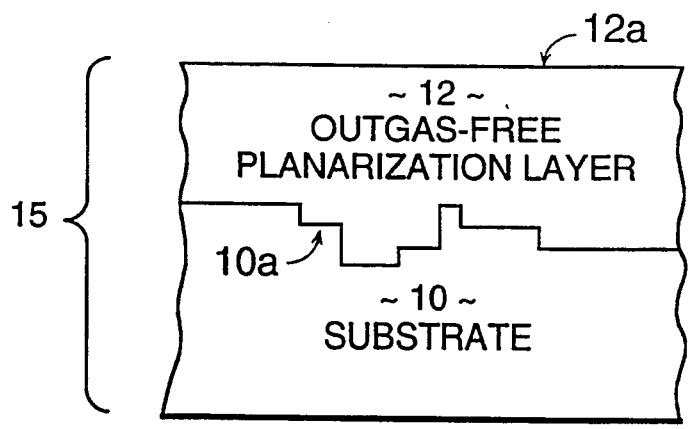
FIG. 1 is a cross-sectional side view showing a planarization-layer deposition, first step in the trilayer lithographic process of the invention.

FIG. 1 is a cross-sectional side view showing a planarization-layer 12 deposited on the nonplanar surface 10a of a semiconductor or other substrate 10. Planarization-layer 12 is composed of an essentially non-outgassing material (an out-gas resistant material) material such as a novolac polymer or a polydimethylglutarimide polymer. These polymers do not include a nitrogen-generating chemistry, and as such, the problem of nitrogen bubble generation is avoided in later steps. The out-gas resistant material of planarization-layer 12 is spin-deposited onto the nonplanar substrate surface 10a to a thickness sufficient to create a substantially planar top surface 12a for planarization-layer 12.

The planarized structure 15, which is composed of spin-deposited planarization-layer 12 and substrate 10 is next placed on a hotplate bake oven and baked, preferably at a temperature of approximately 275–300° C. for approximately 1 to 5 minutes. The temperature should be selected sufficiently high to cure the planarization-layer 12 and reflow its top surface 12a into a substantially planar form but sufficiently low to avoid decomposition of the planarization layer material.

Figure 2:
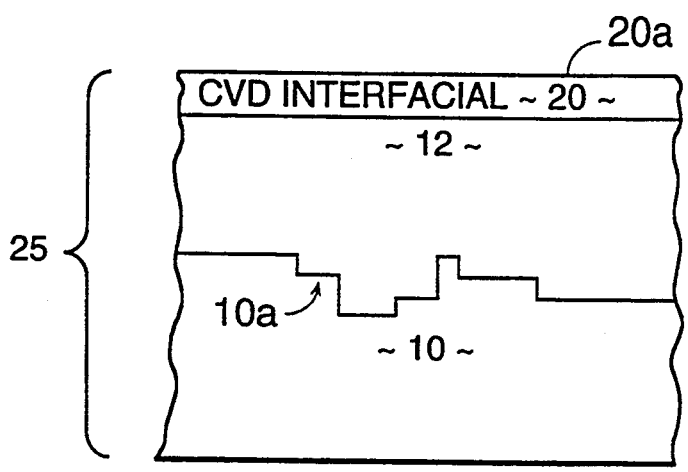
FIG. 2 is a cross-sectional side view showing an interfacial-layer CVD, second step in the trilayer lithographic process of the invention.

Referring to FIG. 2, cured structure 15 is next placed in a chemical vapor deposition (CVD) chamber. The CVD chamber should be capable of operating below the decomposition temperature of the planarization-layer 12. Typically, this means that chemical vapor deposition must take place at or below approximately 300° C. The Novellus Concept-1 ™ available from Novellus Inc. of San Jose, Calif. is an example of equipment capable of providing such low-temperature chemical vapor deposition.

A thin interfacial layer 20, composed of an etch-stopping material such as a silicon oxide compound (e.g., $SiO_2$) or a silicon nitride compound (e.g., $Si_3N_4$), is vapor deposited onto the planarization-layer 12 at a relatively low vapor-deposition pressure (e.g., 2 to 3 Torr) to produce a relatively defect-free top surface 20a with strong and uniform adhesion properties relative to a next-deposited photoresist layer 30. The thickness of interfacial layer 20 is preferably in the range 0.05 to 1.00 micron and more preferably in the range 0.1 to 0.25 micron.

Figure 3:
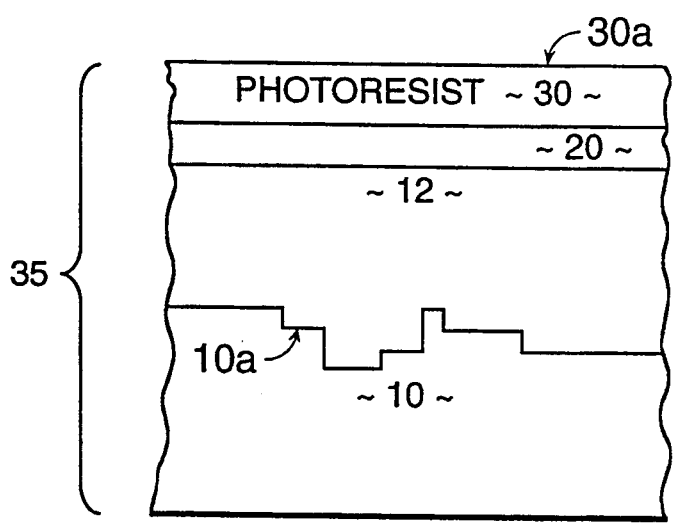
FIG. 3 is a cross-sectional side view showing a photoresist-layer deposition, third step in the trilayer lithographic process of the invention.

Referring to FIG. 3, the CVD coated structure 25, which is composed of interfacial layer 20, planarization-layer 12 and substrate 10, is next transferred to a spin-coating station where a thin layer 30 of conventional photoresist material (e.g. Shipley Microposit 1400 ™ available from Shipley Company of Newton, Mass.) is spin coated onto the interfacial layer 20.

The trilayer structure 35 of FIG. 3, which is composed of thin photoresist layer 30, interfacial layer 20, planarization-layer 12 and substrate 10 is next placed on a hotplate bake oven and baked to a temperature of approximately 95–100° C. for approximately one minute. The temperature should be selected sufficiently high to softbake the photoresist layer 30 for subsequent imaging but not so high that it causes any significant decomposition in the materials of trilayer structure 35.

Baked photoresist layer 30 is preferably of a thickness in the range 0.10 to 1.00 micron and more preferably of a thickness in the range 0.30 to 0.50 micron.

Trilayer structure 35 is then transferred to a high resolution imaging system (not shown), preferably having optics with a depth-of-focus (DoF) substantially equal to or greater than the thickness of photoresist layer 30. (DoF can be equal to or less than one micron for the case where photoresist layer 30 has a comparable, equal or smaller thickness. The relatively small DoF arises as an undesirable side effect of having higher numerical aperture values, e.g. 0.5 or greater.)

Ideally, the thickness of photoresist layer 30 should occupy only a centered subportion of the DoF, and even more ideally the occupied subportion should be small relative to the overall depth of focus. If the DoF is allowed to become small relative to the thickness of photoresist layer 30 (or looking at it the other way, if the thickness of photoresist layer 30 is allowed to become large relative to the DoF), the cross sections of the dark/bright images projected through photoresist layer 30 tends to take on non-rectangular forms (e.g. trapezoidal with a top larger than its bottom or visa versa depending on where the center of the DoF lands). Such non-rectangular image cross-sections are undesirable.

Figure 4:
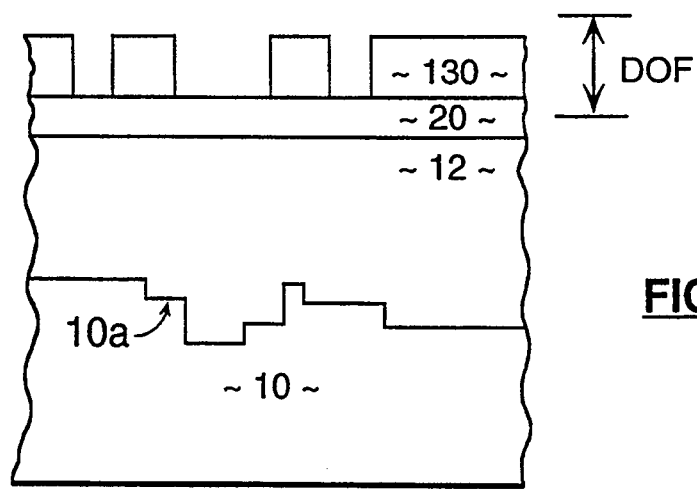
FIG. 4 is a cross-sectional side view showing a photoresist-layer developing, fourth step in the trilayer lithographic process of the invention.

A desired image pattern is projected onto photoresist layer 30 and developed as shown in FIG. 4. Interfacial-layer 20 acts as an etch-stop. The patterned resist layer is now referenced as 130.

Figure 5:
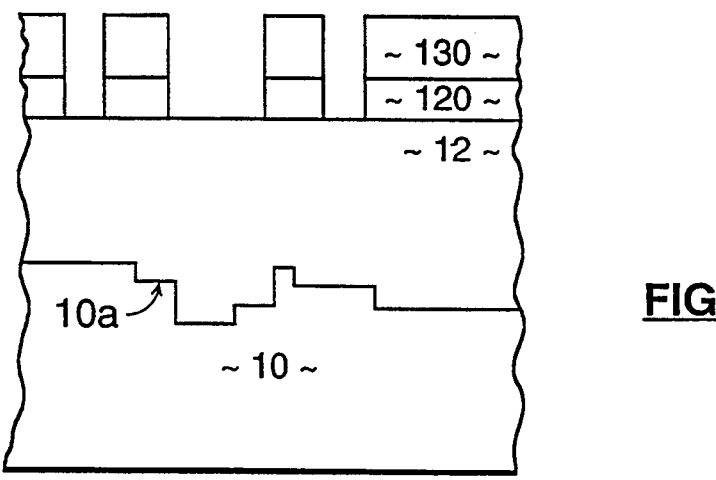
FIG. 5 is a cross-sectional side view showing an interfacial-layer etching, fifth step.

Referring to FIG. 5, the patterned resist layer 130 is preferably, but not of necessity, hardened (cross-polymerized) with ultra-violet radiation or other suitable means so that it will be stronger and better able to resist a later-applied etching agent which is specific to the interfacial layer 20. (An etching agent such as $CF_4$ is typically used for etching $SiO_2$ CVD films).

Layer 20 is then patterned by etching with an etchant specific to the material of layer 20 to thereby produce a correspondingly etched-through interfacial layer 120 as shown in FIG. 5.

Figure 6:
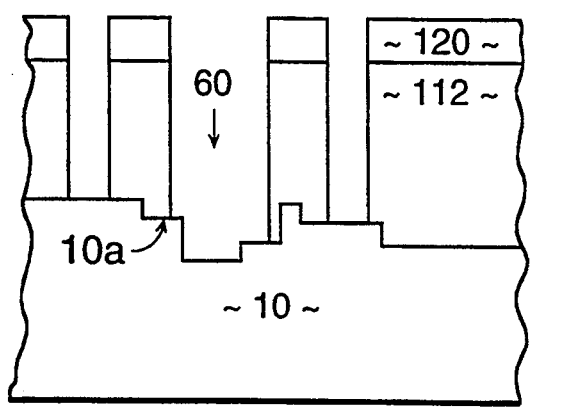
FIG. 6 is a cross-sectional side view showing a planarization-layer etching, sixth step.

Referring to FIG. 6, another etching agent is provided with specificity for the material of planarization layer 12 and the planarization layer is patterned by etching to produce a correspondingly etched-through planarization layer 112 as shown in FIG. 6. Typically, the etchant for layer 12 also removes remaining portions of the upper photoresist layer 130.

The apertures 60 which extend through patterned layers 120 and 112 are then used to selectively modify and/or contact exposed portions of underlying substrate 10. Modification can be provided by next applying radiation, dopants, etchants, metallization materials, and/or other agents through apertures 60 to the underlying substrate 10. Of importance, it is to be recalled that apertures 60 can be defined with a lithographic projection system having a depth of focus (DoF) equal to or less than 1 micron, and as a consequence, the resolution at which apertures 60 are defined can be made relatively high and the diameters of apertures 60 can be made relatively small. (By way of example, aperture diameters of less than one micron can be reliably defined, depending on the wavelength of the projection system. Typical projector wavelengths center around 436 nanometers (G-line) and 365 nm (I-line). Shorter deep-ultraviolet wavelengths of approximately 248 nm are also coming into vogue.)

A broad range of uses can found. In the semiconductor production field, a mask with a desired pattern of apertures 60 is useful for, but is not limited to: (1) defining a P-type or N-type conductivity region at an exposed portion of a semiconductor substrate; (2) defining an electrically insulative region at an exposed portion of the substrate 10; (3) selectively etching away substrate material exposed by the masking layer apertures 60; (4) developing a metallic contact to the exposed substrate surface area 10a; and (5) creating narrow metallic or other (e.g. poly) interconnect lines for routing electrical signals from one contacted substrate area to another.

In the optical device field, integrated optics of small dimensions and tight tolerances can also be defined using the above described photolithographic techniques. The optic elements of a device can be conveniently integrated with and coupled to optoelectronic and electronic components also situated on the same substrate.

In the field of micro-machines, stationary and/or movable elements of micron and submicron dimensions can be photolithographically defined using one or more suitable substrate materials.

The invention accordingly includes semiconductor electronic and/or optical devices defined using the above described technique or equivalents thereof. The invention also extends to so-called micro-machines having stationary or moving parts defined through the above described technique or equivalents thereof.

The relatively small 1.0 to 0.1 micron or less thickness of photoresist layer 30 makes usage of high resolution optics possible. It reduces or eliminates resolution problems previously associated with photolithographic systems where depth of focus approached the thickness dimensions of the photoresist layer. This in turn enables low-cost mass production of high density devices by way of photolithography. The reliable and repeatable definition of apertures 60 is a necessary part of such production. It is made possible because planarization layer 12 consists essentially of an out-gas free material. This allows low-cost bake-hardening of layers 12 and 30 without the detrimental effects of the nitrogen-producing planarization materials found in the prior art.

The reliable and repeatable definition of apertures 60 is also made possible because interfacial layer 120 is essentially particulate free.

The reliable and repeatable definition of apertures 60 is further made possible because two separate, distinct etching agents can be used for defining etched-through layers 130 and 120. The etching mechanism used for patterning layer 120 does no or very little damage to overlying layer 130 and thus, the high resolution pattern of photoresist layer 130 is preserved during the patterning of layer 120.

Also, flexibility is provided in the choice of chemistries for defining layer 120 because CVD film 20 (FIG. 2) can be composed of $SiO_2$ or $Si_3N_4$ or another like material. Depending on the specific application, it can be advantageous to choose one material over the other. CV-Deposited $SiO_2$ and $Si_3N_4$, for example, respond differently to various etch chemistries and the chemistries have different etch selectivities with respect to the CVD interfacial layer 20, the overlying resist layer 30 and the underlying planarization layer 12. The invention therefore includes the step of selecting the material of the interfacial film 20 for optimal etch-selectivity and/or adhesion properties with respect to the material of the planarization layer 12 and/or the photoresist layer 30.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A high-resolution photolithographic method comprising the steps of:
   (a) depositing a planarization layer on a substrate, the planarization layer having a top surface substantially more planar than an underlying surface of the substrate, and the planarization layer having one or more decomposition temperatures at which one or more components thereof decompose;
   (b) chemical-vapor-depositing an interfacial film on the planarization layer at a temperature below the one or more decomposition temperatures of the planarization layer;
   (c) forming a photosensitive resist layer of a thickness equal to or less than one micron on the interfacial film; and
   (d) projecting a pattering light image onto the photosensitive resist layer using a light image projecting system.

2. A high-resolution photolithographic method according to claim 1 wherein said planarization layer consists essentially of an outgas-resistant material that resists giving off gases during said step (b) of chemical-vapor-depositing.

3. A high-resolution photolithographic method according to claim 2 wherein the material of said planarization layer is selected from the group consisting of a novolac polymer and a polydimethylglutarimide polymer.

4. A high-resolution photolithographic method according to claim 1 wherein the material of said planarization layer does not include a material which decomposes to produce nitrogen gas at temperatures used for said steps of chemical-vapor-depositing an interfacial film and/or forming a photosensitive resist layer.

5. A high-resolution photolithographic method according to claim 4 wherein the material of said planarization layer does not include diazonapthoquinone or a like light-sensitive material.

6. A high-resolution photolithographic method according to claim 1 wherein said step of chemical-vapor-depositing an interfacial film further includes selecting the material of the interfacial film to have a desired etch selectivity relative to the material of the planarization layer and/or the resist layer.

7. A high-resolution photolithographic method according to claim 1 wherein said step of chemical-vapor-depositing an interfacial film further includes selecting the material of the interfacial film for optimal adhesion selectivity to the material of the planarization layer and/or the resist layer.

8. A high-resolution photolithographic method according to claim 1 wherein said interfacial film is composed of a silicon oxide compound or a silicon nitride compound.

9. A high-resolution photolithographic method according to claim 8 wherein said interfacial film is selected from the group consisting of $SiO_2$ and $Si_3N_4$.

10. A high-resolution photolithographic method according to claim 1 wherein said step of chemical-vapor-depositing an interfacial film occurs at or below approximately 300° C.

11. A high-resolution photolithographic method according to claim 1 further comprising, after said step (d) of projecting a patterning light image, the addition step of:
(e) forming apertures, corresponding to the projected patterning image, through the planarization layer.

12. A high-resolution photolithographic method according to claim 11 further comprising the additional step of:
using said apertures to form an electronic device and/or an optical device and/or a micro-machine.

13. A high-resolution photolithographic method according to claim 1 wherein the image projecting system has a depth of focus approximately equal to or less than one micron and/or a numerical aperture value greater than 0.5.

14. A method for forming a photosensitive film on a substrate comprising the steps of:
(a) depositing an organic planarization layer on said substrate, the planarization layer having a top surface substantially more planar than an underlying surface of the substrate, and the planarization layer having one or more decomposition temperatures at which one or more components thereof decompose;
(b) chemical-vapor-depositing a non-organic interfacial film on the organic planarization layer at a temperature below the one or more decomposition temperatures of the planarization layer; and
(c) forming a photosensitive resist layer on the interfacial film.

15. The method of claim 14 wherein said non-organic interfacial film is selected from the group consisting of $SiO_2$ and $Si_3N_4$.

16. The method of claim 14 wherein said organic planarization layer consists essentially of an outgas-resistant material that resists giving off gases during said step (b) of chemical-vapor-depositing.

17. The method of claim 16 wherein the material of said planarization layer is selected from the group consisting of a novolac polymer and a polydimethylglutarimide polymer.

18. A high-resolution photolithographic method according to claim 14 further comprising, after said step (d) of projecting a patterning light image, the additional steps of:
(e) etching apertures, corresponding to the projected patterning image, through the exposed photosensitive resist layer to thereby define an aperture pattern in the resist layer; and
(f) using said interfacial film as an etch-stop for the above recited step (e) of etching apertures.

19. A high-resolution photolithographic method according to claim 18 further comprising, after said steps (e) and (f) of etching apertures and using the interfacial film as an etch-stop, the additional steps of:
(g) hardening the patterned resist layer; and
(h) using the patterned resist layer as an etch mask and etching corresponding apertures through the interfacial film to thereby define a pattern of apertures through the interfacial film.

20. A high-resolution photolithographic method according to claim 19 further comprising, after said steps (g) and (h) of etching apertures through the interfacial film, the additional step of:
(i) using the patterned interfacial film as an etch mask and etching corresponding apertures through the planarization-layer.

21. A high-resolution photolithographic method according to claim 1 wherein the step (b) of chemical-vapor-depositing the interfacial film includes limiting the thickness of the interfacial film to no more than approximately one micrometer.

22. A high-resolution photolithographic method according to claim 21 wherein said step (b) of chemical-vapor-depositing the interfacial film includes limiting the thickness of the interfacial film to between 0.10 micrometer and 0.25 micrometer.

23. A high-resolution photolithographic method according to claim 1 wherein said step (c) of forming the photosensitive resist layer includes limiting the thickness of the photosensitive resist layer to between 0.30 micrometer and 0.50 micrometer.

24. A high-resolution photolithographic method according to claim 1 wherein said step (b) of chemical-vapor-depositing the interfacial film includes maintaining a vapor-deposition pressure of approximately 3 Torr or less.

25. A high-resolution photolithographic method according to claim 1 wherein said step (b) of chemical-vapor-depositing the interfacial film includes maintaining a vapor-depositing pressure of approximately 2 Torr or more.

26. A high-resolution photolithographic method according to claim 1 wherein said step (b) of chemical-vapor-depositing the interfacial film includes maintaining a vapor-deposition temperature at or below 300° C.

27. A high-resolution photolithographic method according to claim 1 wherein said step (a) of depositing the planarization layer includes:
(a.1) spin-coating a hardenable non-solid predecessor of the planarization layer material onto the substrate; and
(a.2) baking the planarization layer predecessor to thereby harden it and reflow its top surface into a substantially planar form.

28. A high-resolution photolithographic method according to claim 27 wherein said step (a.2) of baking occurs at a temperature not greater than approximately 300° C.

29. A high-resolution photolithographic method according to claim 1 wherein said step (c) of forming the photosensitive resist layer on the interfacial film includes:
(c.1) spin-coating a hardenable non-solid predecessor of the photosensitive resist material onto the interfacial film; and
(c.2) softbaking the photosensitive resist predecessor to thereby harden it and prepare it for subsequent imaging.

30. A high-resolution photolithographic method according to claim 29 wherein said step (c.2) of softbaking occurs at a temperature below decomposition temperatures of the materials of each of the planarization-layer and the interfacial film.

31. A high-resolution photolithographic method according to claim 30 wherein said step (c.2) of softbaking occurs at a temperature below decomposition temperatures of the photosensitive resist material.

32. A high-resolution photolithographic method according to claim 29 wherein said step (c.2) of softbaking occurs at a temperature no higher than approximately 100° C.

33. A photolithographic method comprising the steps of:
   (a) depositing a planarization layer on a substrate, the planarization layer having a top surface substantially more planar than an underlying surface of the substrate, and the planarization layer having one or more decomposition temperatures at which one or more components thereof decompose;
   (b) forming an etch-stop layer on the planarizing layer at a temperature below the one or more decomposition temperatures of the planarizing layer;
   (c) forming a photosensitive resist layer of a thickness equal to or less than one micron on the etch-stop layer;
   (d) projecting a patterning light image onto the photosensitive resist layer;
   (e) developing first apertures corresponding to the patterning image through the resist layer using a first etching agent whose etching action is substantially blocked by said etch-stop layer;
   (f) after above step (e), developing second apertures corresponding to the patterning image through the etch-stop layer using the developed resist layer as a first etch mask and a second etching agent whose etching action is substantially blocked by the material of the first etch mask;
   (g) after above step (f), developing third apertures corresponding to the patterning image through the planarizing layer using the developed etch-stop layer as a second etch mask and a third etching agent whose etching action is substantially blocked by the material of the second etch mask.

34. A photolithographic method according to claim 33 wherein the planarizing layer is composed substantially of an organic compound and the etch-stop layer is composed substantially of an inorganic compound.

35. A photolithographic method according to claim 33 wherein the planarizing layer consists essentially of an outgas-resistant, organic material that resists giving off gases during said step (b) of forming the etch-stop layer.

36. A photolithographic method according to claim 33 further comprising the step of:
   (f.1) after above step (e), hardening the developed resist layer prior to using the developed resist layer as said first etch mask.

* * * * *

UNITED STATES PATENT AND TRADEMARK OFFICE
CERTIFICATE OF CORRECTION

PATENT NO. : 5,370,969
DATED     : December 6, 1994
INVENTOR(S) : David A. Vidusek It is certified that error appears in the above-identified patent and that said Letters Patent is hereby corrected as shown below:

Column 3, line 38, "Concept-1 TM" should be --Concept-1™--.
Column 3, line 57, "1400 TM" should be --1400™.
Column 6, line 27, "pattering" should be --patterning--.
Column 7, line 49, "14" should be --1--.
Column 8, line 29, "vapor-depositing" should be --vapor-deposition--.
Column 9, lines 5 and 6, "planarization" should be --planarizing--.

Signed and Sealed this

Sixteenth Day of May, 1995

Attest:

BRUCE LEHMAN

*Attesting Officer*     *Commissioner of Patents and Trademarks*